(12) United States Patent
Cheng et al.

(10) Patent No.: US 6,365,475 B1
(45) Date of Patent: Apr. 2, 2002

(54) METHOD OF FORMING A MOS TRANSISTOR

(75) Inventors: Yao-Chin Cheng, Hsin-Chu; Chung-Chiang Lin, Hsin-Chu Hsien; Jih-Wen Chou, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/534,537

(22) Filed: Mar. 27, 2000

(51) Int. Cl.[7] ............................................. H01L 21/336
(52) U.S. Cl. ....................... 438/306; 438/301; 438/289; 438/307
(58) Field of Search ................................ 438/301–303, 438/305–307, 372–374, 519, 521, 527, 529, 546–548, 289

(56) References Cited

U.S. PATENT DOCUMENTS

| | | | |
|---|---|---|---|
| 5,374,836 A | * 12/1994 | Vinal et al. | 257/344 |
| 5,525,822 A | * 6/1996 | Vinal | 257/344 |
| 5,786,620 A | * 7/1998 | Richards, Jr. et al. | 257/408 |
| 5,814,869 A | * 9/1998 | Dennen | 257/408 |
| 6,208,010 B1 | * 3/2001 | Nakazato et al. | 257/544 |

FOREIGN PATENT DOCUMENTS

JP 04337665 * 5/1991 ......... H01L/27/112

* cited by examiner

*Primary Examiner*—Charles Bowers
*Assistant Examiner*—Thanh Nguyen
(74) *Attorney, Agent, or Firm*—Winston Hsu

(57) ABSTRACT

The present invention provides a method of forming a Metal Oxide Semiconductor (MOS) transistor on a substrate of a semiconductor wafer. A gate of the MOS transistor is formed on the substrate. A source and a drain of the MOS transistor are then formed in the substrate. An ion implantation process is performed to form a first doped region, a second doped region and a third doped region. The first doped region is positioned under the gate and overlaps with the channel of the MOS transistor. The second doped region is positioned in a predetermined portion of the substrate under the source. The third doped region is positioned in a predetermined portion of the substrate under the drain. The first doped region, the second doped region, the third doped region, the source, and the drain are all of the same type of semiconductor.

18 Claims, 4 Drawing Sheets

METHOD OF FORMING A MOS TRANSISTOR

BACKGROUND OF THE INVENTION

1. Field of the Invention

The present invention relates to a method of forming a MOS transistor on a substrate of a semiconductor wafer, and more particularly, to a method of enhancing the electrical performance of a MOS transistor.

2. Description of the Prior Art

With the progressive development of very large scale integration (VLSI) circuits, metal-oxide semiconductor (MOS) transistors that consume less power and that can be highly integrated are widely used in the semiconductor and electronics industries. A MOS transistor typically comprises a MOS capacitor, and two doped regions which are complementary to the substrate, called a source and a drain. When a proper voltage is applied, MOS transistors can be used as a kind of switch to control the flow of electricity through a device. As the development of integrated circuits grows ever more complex and precise, controlling the manufacturing process of MOS transistors becomes an increasingly important issue.

Please refer to FIG. 1. FIG. 1 is a cross-sectional view of a prior art MOS transistor 20. In the following description, an n-type MOS transistor is considered. For the prior art method of forming the MOS transistor 20, p-type dopants are used to dope a substrate of a semiconductor wafer 10. A thermal process is performed to drive the dopants into the substrate so as to form a p-well 12. A thermal oxidation process and a thin film deposition process are then performed on the semiconductor wafer 10 to form a silicon dioxide layer and a doped polysilicon layer.

A photoresist layer (not shown in the figure) is coated onto the surface of the semiconductor wafer 10, and a lithographic process is performed on the photoresist layer to define the pattern of a gate 26. Then a dry etching process is performed to form the gate 26, which comprises a gate oxide layer 22 and a gate electrode 24. The photoresist layer is then stripped. An ion implantation process is performed to form low doping drains (LDD) 14 adjacent to the two sides of the gate 26 of the MOS transistor 20. A chemical vapor deposition (CVD) process is then performed to deposit a silicon nitride layer, and an anisotropic etching process is performed to remove the silicon nitride layer down to the surface of the p-well 12 so as to form a spacer 28 on each lateral side of the gate 26. Using the gate 26 and the spacers 28 as hard masks, an ion implantation process is performed to dope n-type dopants into the p-well 12 so as to form a source 16 and a drain 18 of the MOS transistor 20.

Please refer to FIG. 2 and FIG. 3. FIG. 2 is a diagram depicting the doping distribution in the MOS transistor along the line 2–2' of FIG. 1. FIG. 3 is a diagram depicting the doping distribution in the MOS transistor along the line 3–3' of FIG. 1. As shown in FIG. 2, the diagram illustrates the dopant concentration versus depth. Experimental results have shown that the channel doping distribution curve 27 of the MOS transistor 20 is relatively uniform with the rest of the p-well 12, and is higher than desired. This high, uniform doping distribution results in reduced mobility of electrons and holes, and may cause short channel effects (SCE). As shown in the doping distribution curve 29 of FIG. 3, the doping concentration is typically large in both the source 16 and the drain 18. Because the doping concentration at the interface of the source 16 and the p-well 12, or the drain 18 and the p-well 12, is much lower than other source or drain regions, a higher junction capacitance (Cj) may appear at the interface, affecting the electrical performance of the MOS transistor 20.

SUMMARY OF THE INVENTION

It is therefore a primary objective of the present invention to provide a method of forming a MOS transistor on a substrate of a semiconductor wafer so as to solve the above mentioned problems.

In a preferred embodiment, the present invention provides a method of forming a Metal Oxide Semiconductor (MOS) transistor on a substrate of a semiconductor wafer. A gate of the MOS transistor is formed on the substrate. A source and a drain of the MOS transistor are then formed in the substrate. An ion implantation process is performed to form a first doped region, a second doped region and a third doped region. The first doped region is positioned under the gate and overlaps with the channel of the MOS transistor. The second doped region is positioned in a predetermined portion of the substrate under the source, and the third doped region is positioned in a predetermined portion of the substrate under the drain. The first doped region, the second doped region, the third doped region, the source, and the drain are all of the same type of semiconductor.

It is an advantage of the present invention that an ion implantation process is performed to form doped regions under the gate, the source and the drain. The doped regions are the same type of semiconductor as the source and the drain, but the doping dosage is lower. This method is used to form a Super Steep Retrograde (SSR) channel doping distribution in the MOS transistor, and is used to reduce the junction capacitance (Cj) at the interface of the source and the well, and at the drain and the well.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
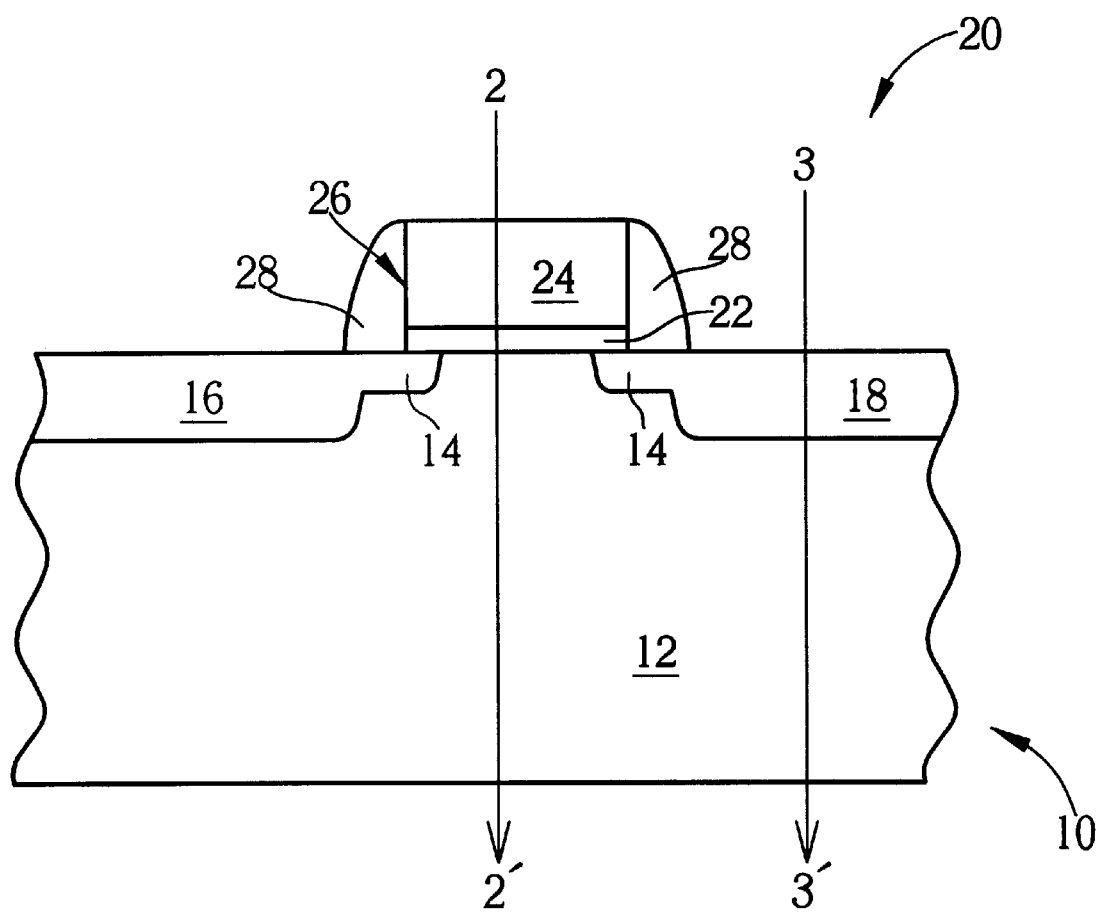
FIG. 1 is a cross-sectional diagram of a prior art MOS transistor.
Figure 2:
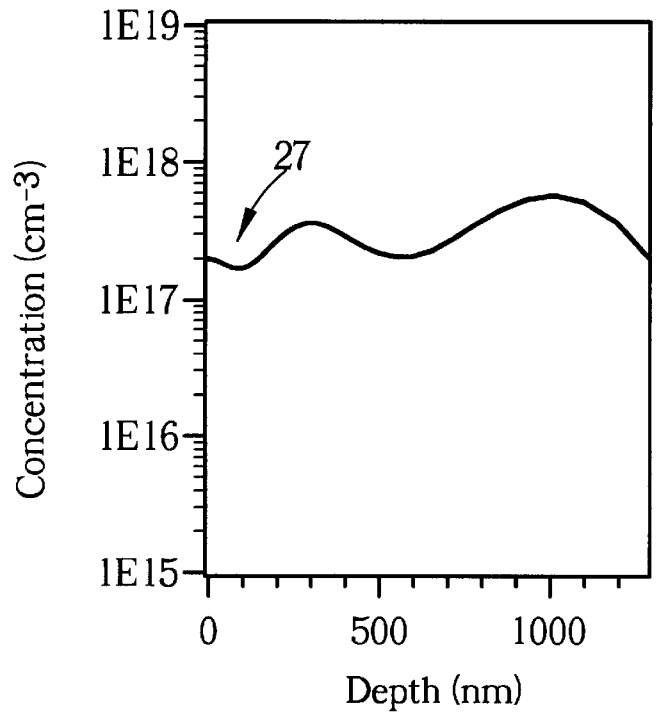
FIG. 2 is a diagram depicting the doping distribution in the MOS transistor along the line 2–2' of FIG. 1.
Figure 3:
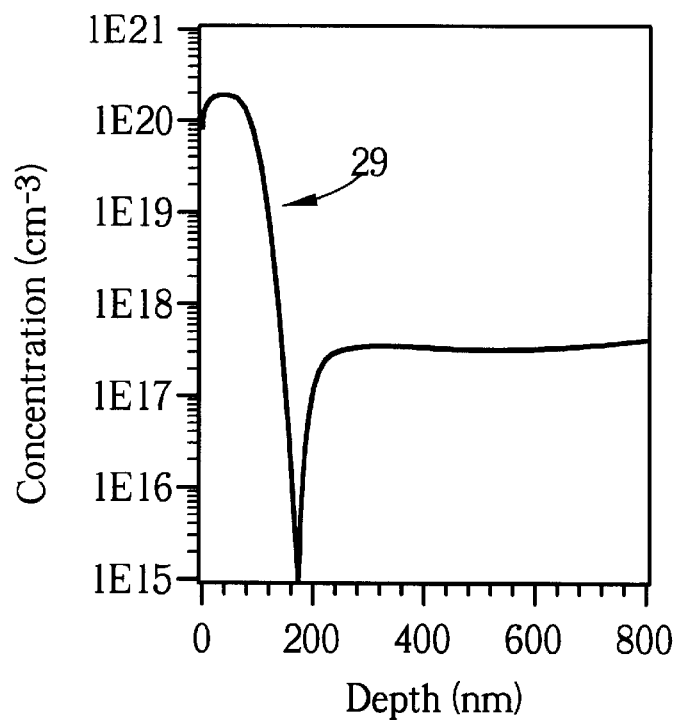
FIG. 3 is a diagram depicting the doping distribution in the MOS transistor along the line 3–3' of FIG. 1.
Figure 4:
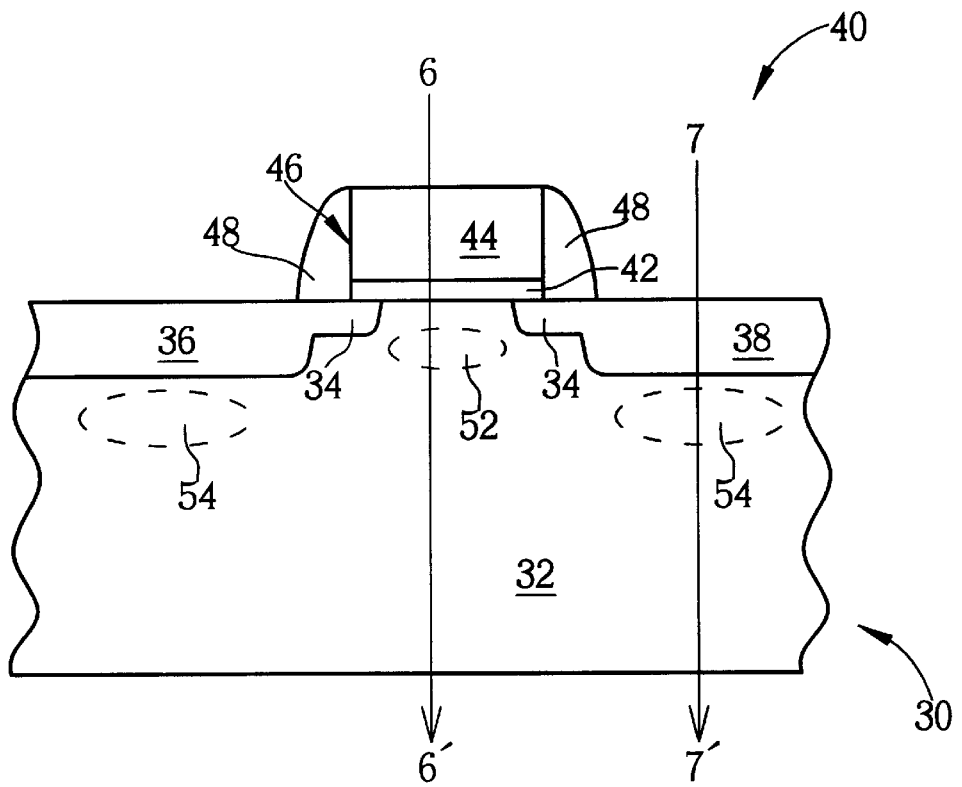
FIG. 4 is a cross-sectional diagram of a MOS transistor according to the present invention.

Please refer to FIG. 4. FIG. 4 is a cross-sectional diagram of a MOS transistor 40 according to the present invention. In the following description, an n-type MOS transistor is considered. In the present invention method of forming a MOS transistor 40, p-type dopants are doped into a substrate of a semiconductor wafer 30. A thermal process is performed to drive the dopants into the substrate so as to form a p-well 32. A thermal oxidation process and a thin film deposition process are then performed on the semiconductor wafer 30 to form a silicon dioxide layer and a doped polysilicon layer. A photoresist layer (not shown in the figure) is coated onto the surface of the semiconductor wafer 30, and a lithographic process is performed on the photoresist layer to define the pattern of a gate 46. Then a dry etching process is performed to form the gate 46, which comprises a gate oxide layer 42 and a gate electrode 44. The photoresist layer is then stripped.

An ion implantation process is performed to form low doping drains (LDD) 34 adjacent to the two sides of the gate 46 of the MOS transistor 40. A chemical vapor deposition (CVD) process is then performed to deposit a silicon nitride layer, and an anisotropic etching process is performed to remove the silicon nitride layer down to the surface of the p-well 32 so as to form a spacer 48 on each lateral side of the gate 46. Using the gate 46 and the spacers 48 as hard masks, an ion implantation process is performed to dope n-type dopants into the p-well 32 so as to form a source 36 and a drain 38 of the MOS transistor 40.

After the formation of the MOS transistor 40, using n-type dopants, which are of the same type as the dopants used to dope the source 36 and in the drain 38, but complementary to the p-well 32, an ion implantation process is performed to simultaneously form n-type doped regions 52, 54 and 56 in the p-well 32. The doped region 52 is positioned under the gate 46 and overlaps with the channel of the MOS transistor 40. The doped region 54 is positioned in a predetermined portion of the substrate under the source 36.

The doped region 56 is positioned in a predetermined portion of the substrate under the drain 38. The doping dosage of the doped regions 52, 54 and 56 is less than the doping dosage of the source 36 and the drain 38.

In the above example, the n-type dopants used to dope the n-type semiconductor doped regions 52, 54 and 56 comprise arsenic (As), phosphorus (P) or antimony (Sb), and the dopants used to dope the p-well comprise $BF_2^+$, boron (B) or indium (In). If using arsenic as the dopant, the doping dosage is about $1 \times 10^{12}$ cm$^{-2}$ to $5 \times 10^{13}$ cm$^{-2}$, and the energy is about 200 keV to 500 keV. If using phosphorus as the dopant, the doping dosage is about $1 \times 10^{12}$ cm$^{-2}$ to $5 \times 10^{13}$ cm$^{-2}$, and the energy is about 150 keV to 250 keV.

Figure 5:
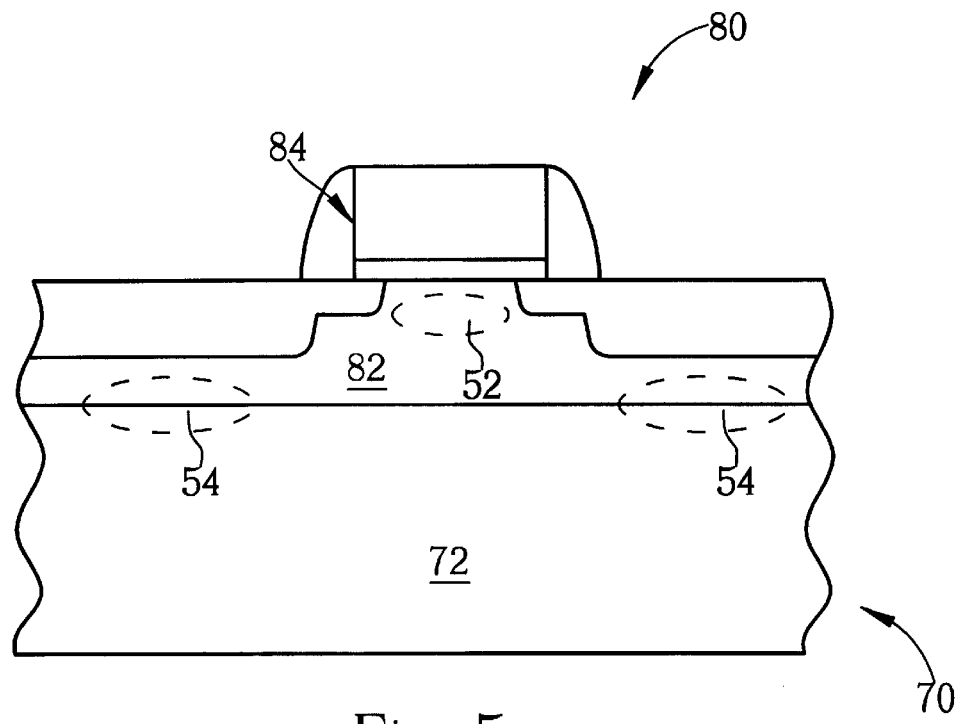
FIG. 5 is a cross-sectional diagram of an alternative MOS transistor according to the present invention.

Please refer to FIG. 5. FIG. 5 is a cross-sectional diagram of an alternative MOS transistor 80 according to the present invention. The alternative example provides a method for forming the MOS transistor 80 on an epitaxy substrate. As shown in FIG. 5, a semiconductor wafer 70 comprises a dielectric layer 72. An ion implantation process is performed on a portion of the dielectric layer 72 predetermined to form a doped region 76 and a doped region 78. A chemical vapor deposition process is performed to grow the epitaxy substrate 82 on the dielectric layer 72. During the growth of the epitaxy substrate 82, high temperatures make the dopants in the dielectric layer 72 diffuse so as to form the doped region 76 and the doped region 78. After forming the substrate 82, the above mentioned processes of the previous embodiment are performed to form the MOS transistor 80. The doped region 74 under the gate 84 can be implanted thereafter, or doped with a threshold voltage ($V_t$) implantation process.

There are various methods of forming the MOS transistor that can be chosen to adjust for different processes. For example, the above mentioned method of the first embodiment can also be applied to form a p-type MOS transistor.

First, an n-well is formed in the substrate. A PMOS transistor is then formed using the same processes previously described. An ion implantation process is performed using p-type dopants to form p-type semiconductor doped regions under the gate, the source and the drain. The dopants used for the doped regions comprise $BF_2^+$, boron (B) or indium (In) and the dopants used to dope the n-well comprise arsenic (As), phosphorus (P) or antimony (Sb). If using boron as the dopant, the doping dosage is about $1 \times 10^{12}$ cm$^{-2}$ to $5 \times 10^{13}$ cm$^{-2}$, and the energy is about 20 keV to 160 keV.

In addition, the process flow can be changed in many ways. In the above method shown in FIG. 4, a first-type well is formed in a predetermined region of the substrate, a second-type MOS transistor is then formed in the well, and three second-type doped regions are formed in the well. The first-type semiconductor is complementary to the second-type semiconductor. That is, the first type may be an n-type semiconductor material, in which case the second type would be a p-type semiconductor material, or vice versa. Another method may replace the well by providing a first-type substrate, in which case a second-type MOS transistor is then formed on the substrate directly, and three second-type doped regions are formed in the substrate. This method yields the same advantages as those of the previous embodiments. Furthermore, the implantation procedure order of the doped regions, of the source and the drain, of the LDD, and even of the threshold voltage, can all be exchanged on a case by case basis.

Figure 6:
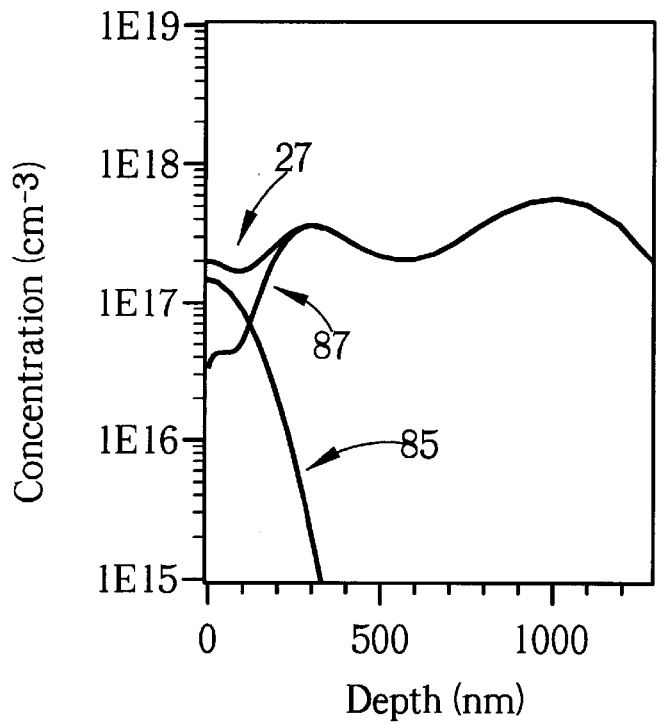
FIG. 6 is a diagram depicting the doping distribution in the present invention MOS transistor along the line 6–6' of FIG. 4.
Figure 7:
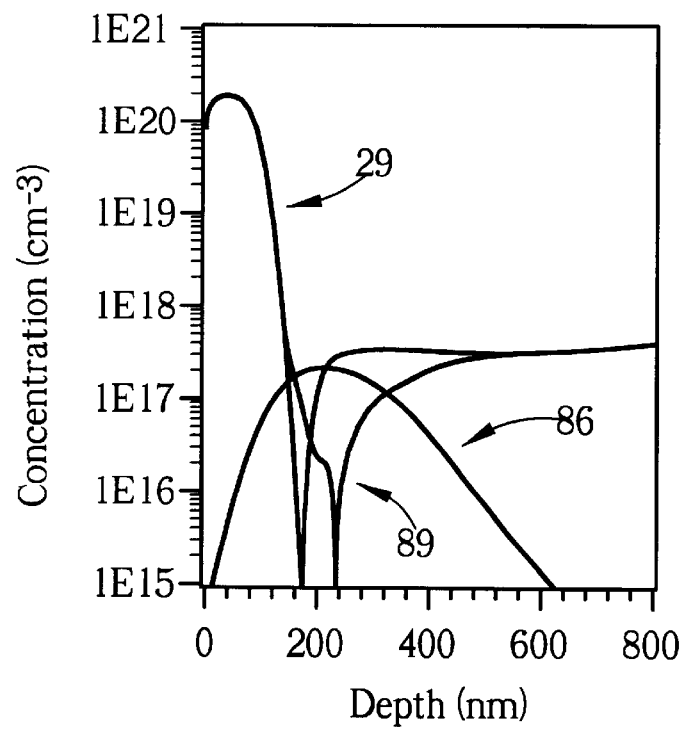
FIG. 7 is a diagram depicting the doping distribution in the present invention MOS transistor along the line 7–7' of FIG. 4.

Please refer to FIG. 6 and FIG. 7. FIG. 6 is a diagram depicting the doping distribution in the MOS transistor along the line 6–6' of FIG. 4. FIG. 7 is a diagram depicting the doping distribution in the MOS transistor along the line 7–7' of FIG. 4. The doping distribution curve 85 shows the dopant concentration distribution of the doped region 52 that is positioned on the channel of the MOS transistor under the gate 46. The doped region 52 changes the channel doping distribution of the MOS transistor 40 from the prior art distribution 27 into a Super Steep Retrograde (SSR) distribution 87. Under the SSR distribution 87, the dopant concentration is reduced in the region near the gate 46. This enhances the mobility of the electrons and holes in the channel, significantly improving the current velocity over the prior art. Additionally, short channel effects (SCE) are prevented.

On the other hand, the doping dosage in the doped region 54 and 56 is less than that of the source 36 and the drain 38, so the doped regions 54, 56 serve as buffer regions between the source 36 and well 32, or between the drain 38 and the well 32. As shown in FIG. 7, the doping distribution curve 86 indicates the dopant concentration distribution of the doped region 56. The doping distribution curve 89 is not so sharp at the interface as the prior art doping distribution curve 29. Hence, the doping concentration at the interface is reduced, which reduces the junction capacitance (Cj), enhancing the electrical performance of the MOS transistor.

In contrast to the prior art method of forming a MOS transistor, in the method according to the present invention, an ion implantation process is performed to form doped regions under the gate, the source and the drain. The doped regions are the same type of semiconductor as the source and the drain but the doping dosage is lower. This method is used to form an SSR channel doping distribution in the MOS transistor, and is used to reduce the junction capacitance (Cj) at the interface of the source and the well, and the drain and the well.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a Metal Oxide Semiconductor (MOS) transistor with a Super Steep Retrograde (SSR) channel doping distribution on a substrate of a semiconductor wafer, the method comprising:

forming a gate of the MOS transistor on the substrate;

forming a source and a drain of the MOS transistor in the substrate; and performing an ion implantation process to simultaneously form a first doped region, a second doped region and a third doped region;

wherein the first doped region is positioned under the gate and overlaps with the channel of the MOS transistor to form the Super Steep Retrograde channel doping distribution, the second doped region is positioned in a portion of the substrate under the source, the third doped region is positioned in a portion of the substrate under the drain, the second doped region and the third doped region are used to reduce the junction capacitance ($C_j$) between the substrate and the source and reduce the junction capacitance between the substrate and the drain, and the first doped region, the second doped region, the third doped region, the source, and the drain are all a first conductivity-type semiconductor.

2. The method of claim 1 wherein the doping dosage of the first doped region, the second doped region, and the third doped region is less than the doping dosage of the source and the drain.

3. The method of claim 1 wherein the first conductivity-type semiconductor is an n-type semiconductor.

4. The method of claim 3 wherein the dopants used to dope the first doped region, the second doped region, and the third doped region comprise arsenic (As), phosphorus (P) or antimony (Sb).

5. The method of claim 1 wherein the first conductivity-type semiconductor is a p-type semiconductor.

6. The method of claim 5 wherein the dopants used to dope the first doped region, the second doped region, and the third doped region comprise $BF_2^+$, boron (B) or indium (In).

7. The method of claim 1 wherein the substrate is a second conductivity-type semiconductor, and the second conductivity-type semiconductor is complementary to the first conductivity-type semiconductor.

8. The method of claim 7 wherein the substrate is of epitaxy.

9. The method of claim 1 wherein the substrate further comprises a second conductivity-type well positioned in a predetermined portion of the substrate, and the MOS transistor is formed in the well, the second conductivity-type semiconductor being complementary to the first conductivity-type semiconductor.

10. A method for enhancing the electrical performance of a Metal Oxide Semiconductor (MOS) transistor, the MOS transistor with a Super Steep Retrograde (SSR) channel doping distribution being formed on a substrate of a semiconductor wafer, the method comprising:

performing an ion implantation process to simultaneously form a first doped region that overlaps with the channel under the gate of the MOS transistor to form the Super Steep Retrograde channel doping distribution, form a second doped region in a portion of the substrate under the source of the MOS transistor, and form a third doped region in a portion of the substrate under the drain of the MOS transistor, the second doped region and the third doped region being used to reduce the junction capacitance ($C_j$) between the substrate and the source and reduce the junction capacitance between the substrate and the drain, the first doped region, the second doped region, the third doped region, the source, and the drain being of a first conductivity-type semiconductor.

11. The method of claim 10 wherein the doping dosage of the first doped region, the second doped region, and the third doped region is lower than the doping dosage of the source and the drain.

12. The method of claim 10 wherein the first conductivity-type semiconductor is an n-type semiconductor.

13. The method of claim 12 wherein the dopants used to dope the first dope region, the second doped region, and the third doped region comprise arsenic (As), phosphorus (P) or antimony (Sb).

14. The method of claim 10 wherein the first conductivity-type semiconductor is a p-type semiconductor.

15. The method of claim 14 wherein the dopants used to dope the first doped region, the second doped region, and the third doped region comprise $BF_2^+$, boron (B) or indium (In).

16. The method of claim 10 wherein the substrate is a second conductivity-type semiconductor, and the second conductivity-type semiconductor is complementary to the first conductivity-type semiconductor.

17. The method of claim 16 wherein the substrates is of epitaxy.

18. The method of claim 10 wherein the substrate further comprises a second conductivity-type well positioned in a predetermined portion of the substrate, and the MOS transistor is formed in the well, the second conductivity-type semiconductor being complementary to the first conductivity-type semiconductor.

* * * * *